US007501688B2

(12) United States Patent  (10) Patent No.: US 7,501,688 B2
Saito  (45) Date of Patent: Mar. 10, 2009

(54) SPIN INJECTION MAGNETIZATION REVERSAL ELEMENT

(75) Inventor: Akira Saito, Yokosuka (JP)

(73) Assignee: Fuji Electric Holdings Co., Ltd. (JP)

( * ) Notice: Subject to any disclaimer, the term of this patent is extended or adjusted under 35 U.S.C. 154(b) by 41 days.

(21) Appl. No.: 11/475,835

(22) Filed: Jun. 27, 2006

(65) Prior Publication Data

US 2007/0001251 A1    Jan. 4, 2007

(30) Foreign Application Priority Data

Jun. 27, 2005   (JP)   ............................. 2005-185876

(51) Int. Cl.
    *H01L 29/82*    (2006.01)
(52) U.S. Cl. ...................................... 257/421; 257/422
(58) Field of Classification Search .......... 257/421–427
    See application file for complete search history.

(56) References Cited

U.S. PATENT DOCUMENTS

| 6,074,707 | A  | * | 6/2000 | Nakazawa et al. | .......... 427/547 |
| 6,249,453 | B1 | * | 6/2001 | You et al. | .................... 365/171 |
| 6,600,638 | B2 | * | 7/2003 | Gill | ........................ 360/324.11 |
| 6,903,400 | B2 | * | 6/2005 | Kikuchi et al. | .............. 257/295 |
| 2004/0145850 | A1 | * | 7/2004 | Fukumoto et al. | .......... 361/143 |
| 2005/0045913 | A1 | * | 3/2005 | Nguyen et al. | .............. 257/200 |

FOREIGN PATENT DOCUMENTS

JP    2004-207707 A    7/2004

OTHER PUBLICATIONS

Yamanouchi, Michihiko, et al. "Abstract for 60th Annual Meeting Phys. Soc. Jpn." Mar. 27, 2005. p. 27aYP-5. Japan.

Berger, L. "Emission of spin waves by a magnetic multilayer traversed by a current." Physical Review B.; Oct. 1, 1996. pp. 9353-9358; vol. 54, No. 13. USA.

Slonczewski, J.C. "Letter to the Editor: Current-drive excitation of magnetic multilayers."; Journal of Magnetism and Magnetic Materials 159; 1996; pp. L1-L7; USA.

(Continued)

*Primary Examiner*—Cuong Q Nguyen
(74) *Attorney, Agent, or Firm*—Rossi, Kimms & McDowell LLP

(57) ABSTRACT

A spin injection magnetization reversal element includes a ferromagnetic fixed layer, an isolation layer and a ferromagnetic free layer. The area of contact between the ferromagnetic fixed layer and the isolation layer is larger than an area of contact between the ferromagnetic free layer and the isolation layer. The ferromagnetic fixed layer may be divided into ferromagnetic first fixed layer and ferromagnetic second fixed layer, and the isolation layer may be divided into first isolation layer and second isolation layer. The ferromagnetic first fixed layer may be arranged on one of opposed principal surfaces of the ferromagnetic free layer with the first isolation layer in between, and the ferromagnetic second fixed layer may be arranged on the other of the opposed principal surfaces of the ferromagnetic free layer with the second isolation layer in between. The element holds recorded magnetization and can reverse magnetization with a small current density.

22 Claims, 9 Drawing Sheets

OTHER PUBLICATIONS

Katine, J.A. et al. "Current-Driven Magnetization Reversal and Spin-Wave Excitations in Co/Cu/Co Pillars"; Physical Review Letters; Apr. 2000; vol. 84, No. 14; pp. 3149-3152; USA.

Yamaguchi, A et al. "Real-Space Observation of Current-Driven Domain Wall Motion in Submicron Magnetic Wires"; Physical Review Letters; Feb. 20, 2004; vol. 92, No. 7; pp. 077205-1-077205-4; USA.

Related co-pending U.S. Appl. No. 11/278,613; Akira Saito; "Spin Injection Magnetic Domain Wall Displacement Device and Element Thereof"; filed Apr. 4, 2006; Spec. pp. 1-71; Figs. 1-22B.

Related co-pending U.S. Appl. No. 11/379,474; Akira Saito; "Spin Injection Magnetic Domain Wall Displacement Device and Element Thereof"; filed Apr. 20, 2006; Spec. pp. 1-42; Figs. 1-14B.

* cited by examiner

SPIN INJECTION MAGNETIZATION REVERSAL ELEMENT

CROSS REFERENCE TO RELATED APPLICATIONS

This application claims priority from application Serial No. JP 2005-185876, filed on Jun. 27, 2005, the contents of which are incorporated herein in their entirety.

BACKGROUND OF THE INVENTION

A. Field of the Invention

The present invention relates to a basic structure element forming a magnetic sensor or a magnetic memory, and a device using the element. More specifically, the invention relates to an element that controls electron spin injection to form a magnetic random access memory having a large capacity and including no mechanical driving section, or to an element forming a weak electric current sensor that detects electron spin injection, and a device using the element.

B. Description of the Related Art

FIG. 8 is a view schematically showing a cross sectional structure for explaining an example of an arrangement of a previously proposed GMR (Giant Magneto-Resistance) element making use of a GMR effect. For example, on silicon insulation substrate 200 with a silicon oxide film formed on the surface thereof, fixed layer electrode 208, ferromagnetic fixed layer 205 (with a thickness of approximately 40 nm and a diameter of approximately 200 nm) made of a material such as Co, isolation layer 204 (with a thickness of approximately 6 nm and a diameter of approximately 200 nm) of nonmagnetic metal, ferromagnetic free layer 206 (with a thickness of approximately 2.5 nm and a diameter of approximately 200 nm) made of a material such as Co, and free layer electrode 207 are formed in that order. It is known that such a GMR structure element can reverse the direction of magnetization of ferromagnetic free layer 206 by spin current injection from the side of free layer electrode 207, that is, injection of electrons with polarized spins from the side of fixed layer electrode 208 (see, for example, JP-A-2004-207707 and J. A. Katine et al., "Current-Driven Magnetization Reversal and Spin-Wave Excitations in Co/Cu/Co Pillars", Physical Review Letters, Vol. 84, No. 14, pp. 3149-3152 (2000)).

The operation principle of the element is explained as follows. First, a magnetic field with a sufficient strength is applied to the element to align the directions of magnetization of ferromagnetic fixed layer 205 and ferromagnetic free layer 206 in the same direction. FIG. 9A is a schematic cross sectional view showing the case in which the directions of magnetization in the ferromagnetic layers in the element shown in FIG. 8 are aligned rightward, with arrows in the figure showing the directions of magnetization in the respective ferromagnetic layers. This state is referred to as the parallel state (P-state). In this state, an electric current made to flow in the direction from the side of fixed layer electrode 208 to the side of free layer electrode 207 causes electrons to be injected from free layer 207 into ferromagnetic free layer 206. In free layer electrode 207, the electron spins are in a state in which the distribution of up-spins matches that of down-spins. In ferromagnetic free layer 206, however, due to interaction (s-d interaction) between the electron spins and the spins of ferromagnetic metal atoms, spins of the conduction electrons are polarized so that the spins in parallel with the direction of magnetization of ferromagnetic free layer 206 are a majority. This is referred to as polarization of spin. However, ferromagnetic free layer 206 of the layered films now being considered is thin, so that the polarization is slight. When the conduction electrons with their slightly polarized spins pass through isolation layer 204 to reach the surface of ferromagnetic fixed layer 205, electrons having spins in parallel with the direction of magnetization of ferromagnetic fixed layer 205 are injected into ferromagnetic fixed layer 205. However, electrons having spins that are opposite to the direction of the magnetization of ferromagnetic fixed layer 205 are reflected to be injected into ferromagnetic free layer 206 again. Ferromagnetic fixed layer 205, being thick, functions as a spin filter. It gives priority to the passage of electrons that have spins that are in parallel with the direction of the magnetization of ferromagnetic fixed layer 205. As a result, majority carriers in ferromagnetic free layer 206 become electrons that have spins opposite to the direction of the magnetization of ferromagnetic fixed layer 205. Each of the electrons exerts a torque on the magnetization of ferromagnetic free layer 206 in the direction to reverse the direction of magnetization thereof. A current exceeding a certain level of a critical current causes the direction of magnetization of ferromagnetic free layer 206 to rotate by the exerted torque, by which the state with the directions of magnetization of ferromagnetic free layer 206 and ferromagnetic fixed layer 205 changes from the P-state shown in FIG. 9A to an antiparallel state (AP state) shown in FIG. 9B.

Next, an explanation will be made about the case in which a current is made to flow from free layer electrode 207 to fixed layer electrode 208 in the element in the AP-state. In this case, electrons are injected from fixed layer electrode 208 to ferromagnetic fixed layer 205. Also in fixed layer electrode 208, the electron spins are in a state in which the distribution of up-spins matches that of down-spins. In the ferromagnetic layers, however, there is interaction (s-d interaction) between the electron spins and the spins of ferromagnetic metal atoms. Here, thick ferromagnetic fixed layer 205 causes spins of the conduction electrons to be polarized so that spins in parallel with the direction of magnetization of ferromagnetic fixed layer 205 are a majority. When the conduction electrons with largely polarized spins pass through isolation layer 204 to reach the surface of ferromagnetic free layer 206, a majority of electrons having spins in antiparallel with the direction of magnetization of ferromagnetic free layer 206 are injected into ferromagnetic free layer 206. As a result, each of the injected electrons which have spins in a direction that is in parallel with the direction of the magnetization of ferromagnetic fixed layer 205 exerts a torque on the magnetization of ferromagnetic free layer 206 in the direction to reverse the direction of magnetization thereof. A current exceeding a certain level of a critical current causes the direction of the magnetization of ferromagnetic free layer 206 to rotate by the exerted torque, by which the state with the directions of magnetization of ferromagnetic free layer 206 and ferromagnetic fixed layer 205 returns from the AP-state shown in FIG. 9B to the P state shown in FIG. 9A.

The electric resistance between two electrodes of a GMR element is known to be small in the P-state and large in the AP-state with the rate of change being several tens of percent. By using the GMR effect, a memory element can be formed. However, for causing magnetization reversal by current injection, a large current density of the order of $10^8$ A/cm$^2$ is necessary at present.

The above-explained technology causes magnetization to be inverted by flowing a current in the element. Its operation principle is that magnetization reversal is caused by a torque exerted on the magnetization of the ferromagnet due to electron spin when spin-polarized electrons are injected into a ferromagnet. Therefore, in order to lower the current density necessary to cause magnetization reversal, the magnetization reversal must be caused by a slight amount of injected electrons. This necessitates that the volume and the magnitude of saturation magnetization of a ferromagnetic free layer to be subjected to magnetization reversal be made small. However, making the volume and the magnitude of saturation magnetization of a ferromagnetic free layer small results in degradation of resistance of recorded magnetization to thermal agitation, and this makes minute magnetization unstable. As a result, a problem arises which makes retention of magnetization impossible.

The present invention was made in light of the foregoing problem with an object of providing a memory element and a weak current sensor in which a characteristic of retaining recorded magnetization and facility in magnetization reversal that enables magnetization reversal with a small current density are made compatible.

The present invention is directed to overcoming or at least reducing the effects of one or more of the problems set forth above.

SUMMARY OF THE INVENTION

The present invention is based on the finding that, in making a ferromagnetic fixed layer and a ferromagnetic free layer opposite to each other with an isolation layer in between, spin-polarized electrons can be efficiently injected or reflected between the ferromagnetic fixed layer and the ferromagnetic free layer by increasing the opposed areas or by making the ferromagnetic fixed layer substantially surround the ferromagnetic free layer.

Namely, the invention is characterized in that, in a spin injection magnetization reversal element including a ferromagnetic fixed layer, an isolation layer and a ferromagnetic free layer in that order, in which element flow of a current between the ferromagnetic fixed layer and the ferromagnetic free layer causes transition between a state in which the direction of the magnetization of the ferromagnetic fixed layer and the direction of the magnetization of the ferromagnetic free layer are in parallel with each other and a state in which the directions of the magnetization are in antiparallel with each other, an area with which the ferromagnetic fixed layer is in contact with the isolation layer is larger than an area with which the ferromagnetic free layer is in contact with the isolation layer.

An electrode can be connected onto one surface of the ferromagnetic free layer, and the ferromagnetic fixed layer can be arranged on the other surfaces of the ferromagnetic free layer with the isolation layer in between.

In another aspect, the invention is characterized in that, in a spin injection magnetization reversal element including a ferromagnetic fixed layer, an isolation layer and a ferromagnetic free layer, in which element flow of a current between the ferromagnetic fixed layer and the ferromagnetic free layer causes transition between a state in which the direction of the magnetization of the ferromagnetic fixed layer and the direction of the magnetization of the ferromagnetic free layer are in parallel with each other and a state in which the directions of the magnetization are in antiparallel with each other, the ferromagnetic fixed layer is divided into a ferromagnetic first fixed layer and a ferromagnetic second fixed layer, the isolation layer is divided into a first isolation layer and a second isolation layer, the ferromagnetic first fixed layer is arranged on one of opposed principal surfaces of the ferromagnetic free layer with the first isolation layer in between, the ferromagnetic second fixed layer is arranged on the other one of the opposed principal surfaces of the ferromagnetic free layer with the second isolation layer in between, and the ferromagnetic first fixed layer and the ferromagnetic second fixed layer are brought into conduction.

It is preferable that a product of the magnetization and the volume of the ferromagnetic fixed layer is larger than a product of the magnetization and the volume of the ferromagnetic free layer.

Moreover, it is preferable that the saturation magnetization of the ferromagnetic free layer is smaller than the saturation magnetization of the ferromagnetic fixed layer. Furthermore, it is preferable that the coercive force of the ferromagnetic free layer is smaller than the coercive force of the ferromagnetic fixed layer. It is also preferable that the ferromagnetic fixed layer is connected to a plurality of electrodes conducting one another.

The isolation layer preferably is made of nonmagnetic metal or insulation material, and in particular, preferably is made of copper or aluminum oxide. The ferromagnetic fixed layer and the ferromagnetic free layer preferably are made of metallic cobalt.

In a related GMR structure element, the main purpose for improving the efficiency of electron spin injection has been to intensify s-d interaction in a ferromagnetic fixed layer in order to realize approximately 100% spin polarization. In the present invention, however, by adopting a new arrangement of a ferromagnetic fixed layer and a ferromagnetic free layer, efficient injection or reflection of polarized electron spins becomes possible between the ferromagnetic fixed layer and the ferromagnetic free layer without relying on s-d interaction. As a result, it becomes possible to reduce the critical current density necessary for magnetization reversal, or it becomes possible to ensure thermal stability by increasing the volume or the saturation magnetization of the ferromagnetic free layer.

An element formed according to the invention makes it possible to form a magnetic sensor or memory. For example, large number of the elements according to the invention can be integrated on a substrate on which silicon semiconductor CMOS circuits also are integrated, and the elements can be combined with the circuits to produce a magnetic random access memory which has a large recording capacity and includes no mechanical driving sections. In addition, the element according to the invention exhibits a magnetoresistance effect which changes a state of magnetization in the element depending on the direction of a current flowing between electrode terminals to change electric resistance between the terminals. Thus, the element can be also used as a weak current sensor.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

In the following, embodiments of the invention will be explained with reference to attached drawings. First, the principle of the invention will be explained with reference to FIG. 7.

Figure 7:
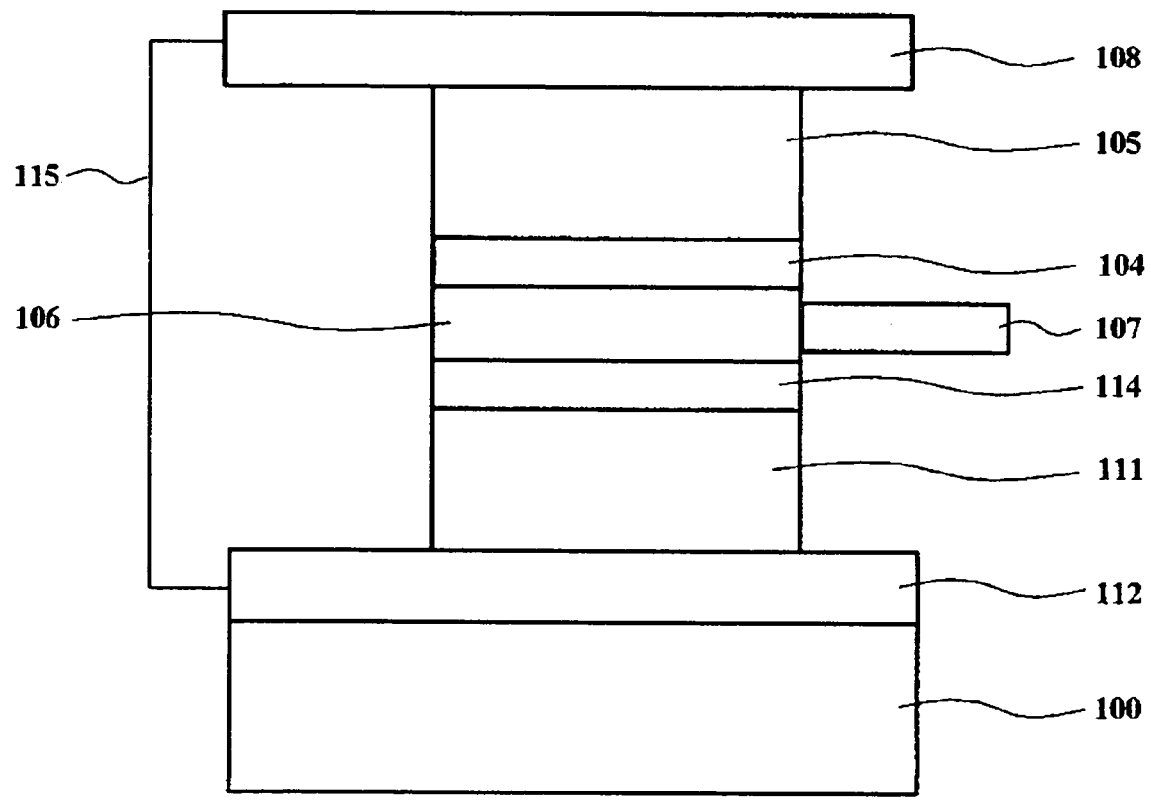
FIG. 7 is a schematic cross sectional view for explaining the principle of the invention.

FIG. 7 is a schematic cross sectional view for explaining the principle of the invention. On insulation substrate 100, second fixed layer electrode 112, ferromagnetic second fixed layer 111, second isolation layer 114, ferromagnetic free layer 106, first isolation layer 104, ferromagnetic first fixed layer 105 and first fixed layer electrode 108 are formed in this order. First, fixed layer electrode 108 and second fixed layer 112 are brought into conduction by wiring 115 on the outside of the element to be connected to an external power supply (not shown). In addition, free layer electrode 107 is connected to ferromagnetic free layer 106. Free layer electrode 107 is also connected to the external power supply.

Ferromagnetic first fixed layer 105 and ferromagnetic second fixed layer 111 are formed so that magnetization is more easily fixed compared with ferromagnetic free layer 106. Specifically, ferromagnetic first fixed layer 105 and ferromagnetic second fixed layer 111 are formed so that their magnitudes of saturation magnetization are large, their volumes are large, or both of the conditions are satisfied, in order to reverse only the magnetization of ferromagnetic free layer 106 when a current is supplied to the element.

A current supplied to the element flows between wiring 115 and free layer electrode 107. Specifically, the current is to flow in the following two paths.

First Path

Wiring 115, second fixed layer electrode 112, ferromagnetic second fixed layer 111, second isolation layer 114, ferromagnetic free layer 106 and free layer electrode 107

Second Path

Wiring 115, first fixed layer electrode 108, ferromagnetic first fixed layer 105, first isolation layer 104, ferromagnetic free layer 106 and free layer electrode 107

Figure 8:
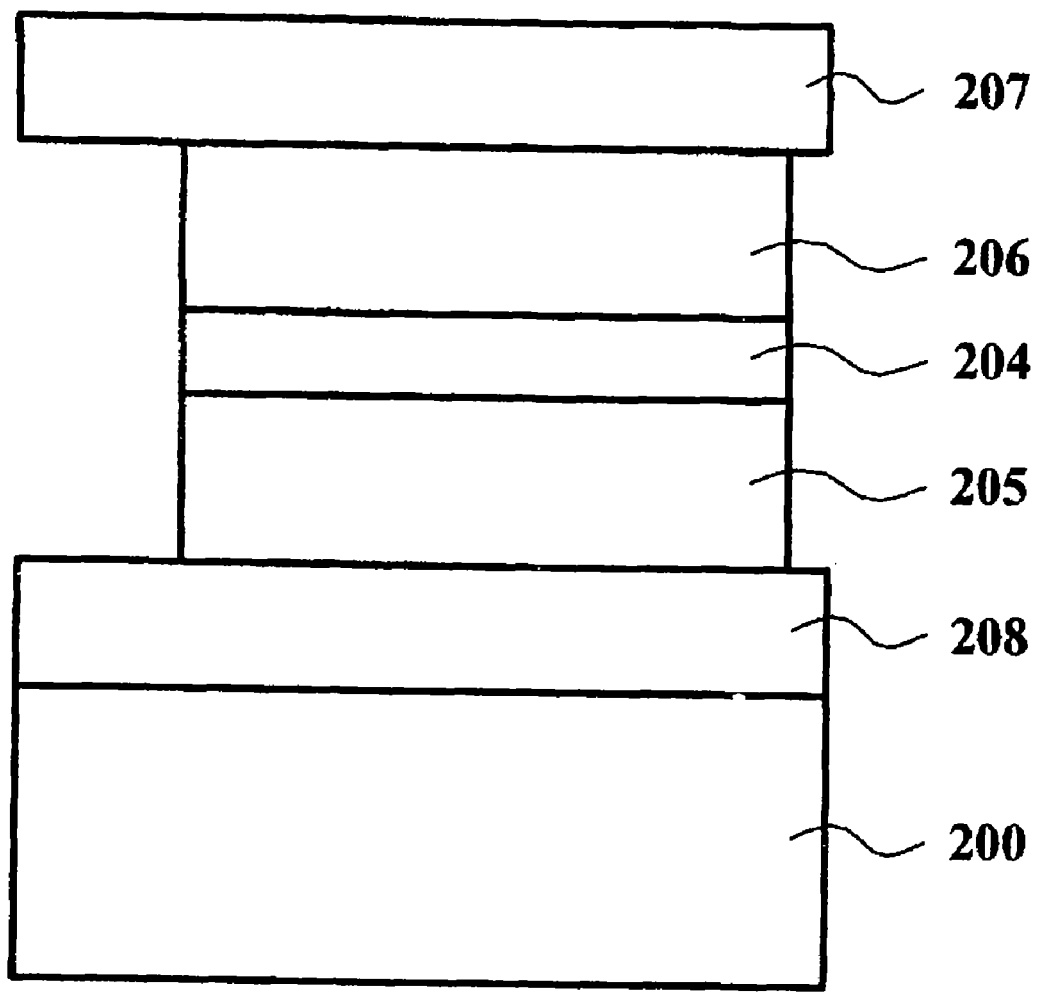
FIG. 8 is a schematic cross sectional view for explaining an example of an arrangement of a related GMR element.
Figure 9A:
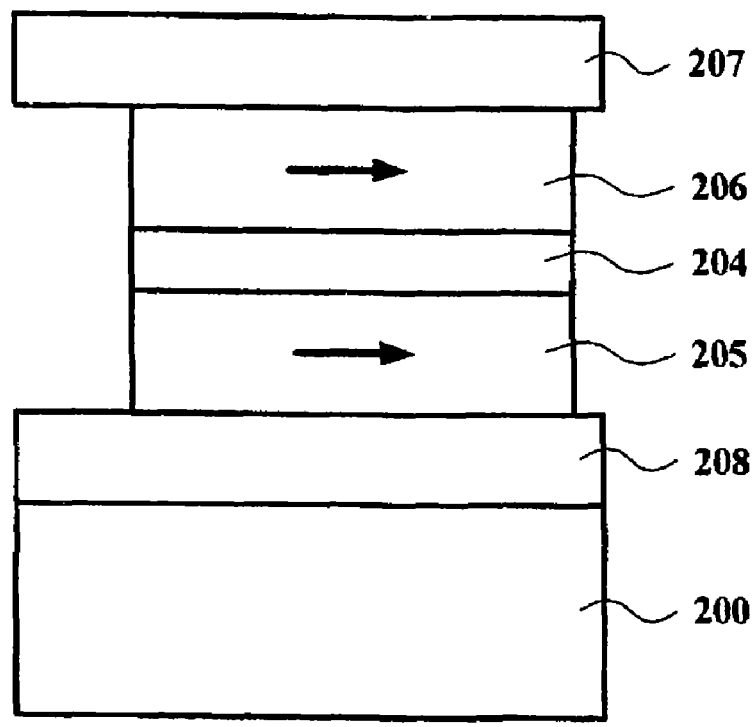
FIG. 9A is a schematic cross sectional view for explaining the operation principle of the related GMR element shown in FIG. 8, the view showing the element being in the P-state.
Figure 9B:
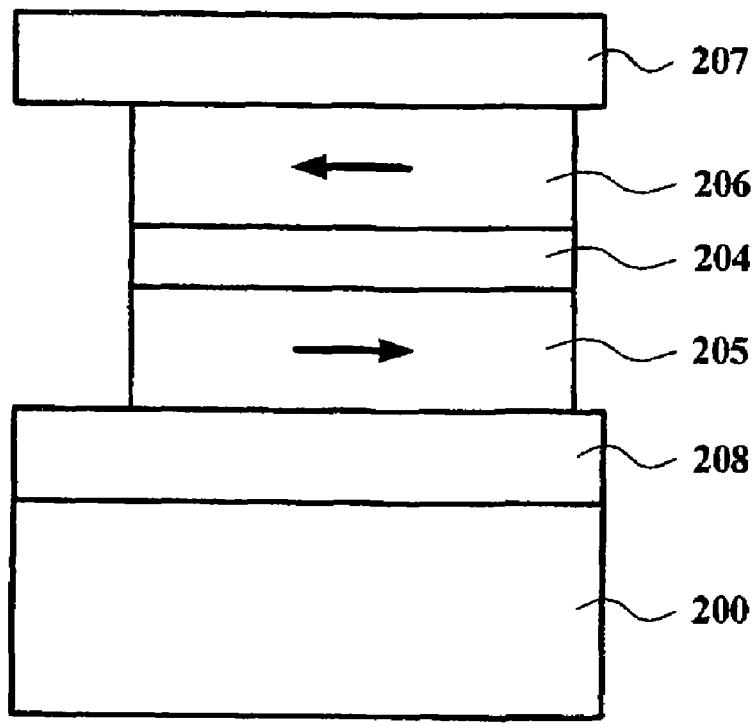
FIG. 9B is a schematic cross sectional view for explaining the operation principle of the related GMR element shown in FIG. 8, the view showing the element being in the AP-state.

First, with an external magnetic field applied, directions of magnetization of ferromagnetic first fixed layer 105 and ferromagnetic second fixed layer 111 are maintained in the same direction. The state of an electron spin in which the direction of spin is in parallel with the direction of the magnetization is referred to as the up-spin. In this state, consider the case of letting a current flow from free layer electrode 107 to wiring 115. At this time, electrons flow from wiring 115 to free layer electrode 107. By thickening the film thicknesses of ferromagnetic first and second fixed layers 105 and 111, electrons move in each of ferromagnetic first and second fixed layers 105 and 111 a longer distance as compared with an electron spin relaxation distance, during which the electron spin is polarized into the up-spin. Therefore, electrons with most of spins thereof being up-spins are injected from both of upper and lower interfaces of ferromagnetic free layer 106 at the same time. As a result, torque is more efficiently exerted by the spins of the injected electrons on the magnetization of ferromagnetic free layer 106, by which the direction of the magnetization thereof quickly reverses in the directions of the magnetization of ferromagnetic first and second fixed layers 105 and 111. This reduces critical current density on the order of ½ compared with the density in the related arrangement of injecting spin-polarized electrons only from ferromagnetic fixed layer 205 provided on one side of ferromagnetic free layer 206 as shown in FIG. 8.

Next, consider the case of letting a current flow from wiring 115 to free layer electrode 107, that is, the case of injecting electrons from ferromagnetic free layer 106 to ferromagnetic first and second fixed layers 105 and 111. Electrons with the proportion of up-spin and the proportion of down-spin being the same in free layer electrode 107 path through first and second isolation layers 104 and 114 while being insufficiently spin-polarized due to thin ferromagnetic free layer 106 and reach the interface between first isolation layer 104 and ferromagnetic first fixed layer 105 and the interface between second isolation layer 114 and second ferromagnetic fixed layer 111, respectively. Here, in each of ferromagnetic first and second fixed layers 105 and 111, the potential energy to electrons with up-spins, whose directions are in parallel with the directions of magnetization of ferromagnetic first and second fixed layers 105 and 111, becomes low. However, electrons with down-spins, whose directions are in antiparallel with the directions of magnetization of ferromagnetic first and second fixed layers 105 and 111, are reflected at the upper and lower interfaces by high potential energy of each of ferromagnetic first and second fixed layers 105 and 111 to be efficiently injected into ferromagnetic free layer 106 again from the upper and lower interfaces. Namely, electrons with down-spins are reflected a plurality of times by high potential barriers in thick ferromagnetic first and second fixed layers 105 and 111 and are confined in ferromagnetic free layer 106. Therefore, electrons, a large majority of which are those with down-spins, exert torque on the magnetization of ferromagnetic free layer 106 so that the direction of magnetization becomes in antiparallel with the directions of magnetization of ferromagnetic first and second fixed layers 105 and 111. Consequently, the magnetization of ferromagnetic free layer 106 is reversed more quickly compared with the case without the confinement. This, compared with the case of making electrons reflected by only ferromagnetic fixed layer 205 provided on one side of ferromagnetic free layer 206, reduces critical current density by from ½ to 1/10.

The effect can be obtained by not only the arrangement of holding both sides of a ferromagnetic free layer by ferromagnetic fixed layers as shown in FIG. 7, but also by an arrangement of increasing an area of the surface of a ferromagnetic free layer facing a ferromagnetic fixed layer. Moreover, by providing a structure in which a ferromagnetic free layer is substantially surrounded by a ferromagnetic fixed layer, a large effect can be obtained. Furthermore, by combining the arrangement of increasing the area and the structure of substantially surrounding the ferromagnetic free layer, the largest effect can be obtained. For providing the structure in which a ferromagnetic free layer is substantially surrounded by a ferromagnetic fixed layer, an arrangement can be adopted in which the ferromagnetic free layer is surrounded, except a part for connecting the ferromagnetic free layer to the free layer electrode by the ferromagnetic fixed layer with an isolation layer provided between, for example.

In addition, partial realization of the effect can be made possible by partially adopting the surrounding structure, though a complete effect of confinement cannot be obtained. The partially surrounding structure in this case can be achieved by making the area of the ferromagnetic fixed layer larger in a section in contact with the isolation layer compared with the area of the ferromagnetic free layer in a section in contact with the isolation layer. For example, a curved convex surface is formed on the ferromagnetic free layer, on which surface the isolation layer is provided. Then, the ferromagnetic fixed layer is arranged with the isolation layer in between the ferromagnetic free layer and the ferromagnetic fixed layer. Thus, the area of the ferromagnetic fixed layer in the section in contact with the isolation layer can be made larger compared with the area of the ferromagnetic free layer in the section in contact with the isolation layer.

As another arrangement, there is one in which the area of the surface of the ferromagnetic fixed layer facing the ferromagnetic free layer is made larger compared with the volume of the ferromagnetic free layer. With this arrangement, the effect also can be obtained.

Magnetic metal, ferromagnetic semiconductor or ferromagnetic oxide can be used as the magnetic material of the ferromagnetic free layer. In particular, a material such as Co, permalloy ($Ni_{80}Fe_{20}$ or $Ni_{81}Fe_{19}$, for example), CoFe (preferably $Co_{90}Fe_{10}$), Fe, NiMnSb, $Co_2MnAl$, $Co_2MnSi$, $Co_2MnGe$, CoCrFeAl, FePt, $Sr_2FeMoO_6$, $Fe_2O_3$, CoFeB, CoHfTa, NiCoFe, $Ni_{45}Fe_{55}$, NiFe, CoZrNb, an FeCoN alloy, an FeAlN alloy, a NiFeMo alloy or an FeTaN alloy is preferable.

A material having a large magnetic anisotropy constant and a large coercive force is preferable for the magnetic material of the ferromagnetic fixed layer. In particular, a material such as Co, a CoPt alloy, FePt, CoCr, CoPtCr, CoPtCrB, CoPtCrTaB, a CoPt artificial lattice film, a CoPd artificial lattice film or a $CoPtCr—SiO_2$ granular film is preferable.

A nonmagnetic metal or oxide can be used for the material of the isolation layer. When using nonmagnetic metal, Cu, V, Nb, Mo, Rh, Ta, W, Re, Ir, Pt or Pd is preferable. When using oxide, oxide of aluminum or MgO is preferable. Moreover, a two-layer laminated film with a film of the nonmagnetic metal and a film of the oxide can be used.

In the following, more detailed explanations will be made about examples of the invention.

EXAMPLE 1

Figure 1A:
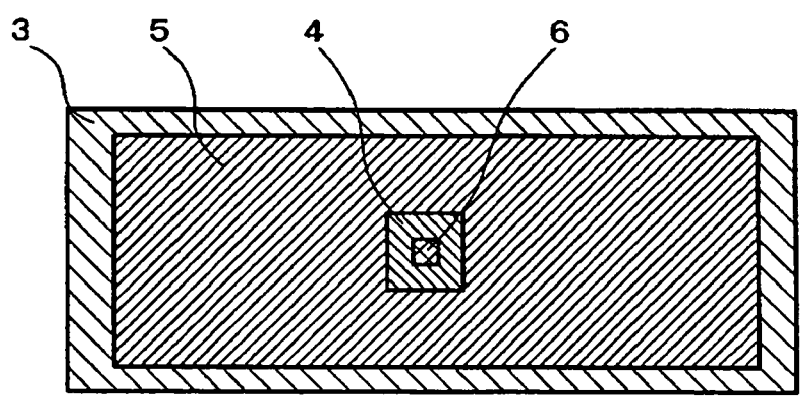
FIG. 1A is a schematic cross sectional view taken on line A-A of FIG. 1B for explaining the arrangement of an element of Example 1 according to the invention.
Figure 1B:
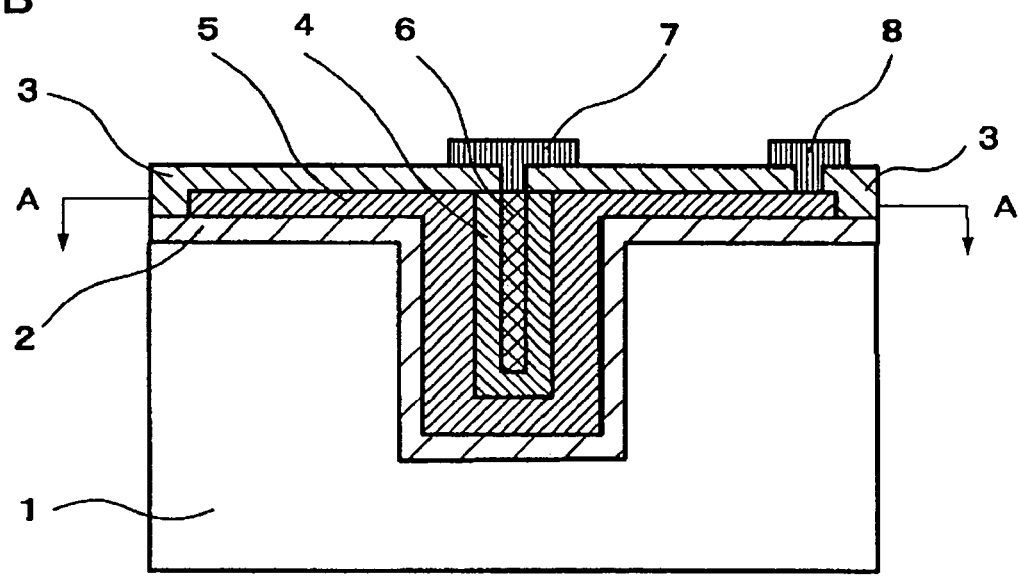
FIG. 1B is a schematic cross sectional view for explaining the arrangement of the element of Example 1 according to the invention.

FIGS. 1A and 1B are views for explaining the arrangement of an element as Example 1 according to the invention, with FIG. 1B being a schematic cross sectional view and FIG. 1A being a schematic cross sectional view taken on line A-A of FIG. 1B. Substrate insulation layer 2 is formed on the surface of substrate 1 formed with a trench structure having a square horizontal cross section. Ferromagnetic fixed layer 5 is arranged on substrate insulation layer 2 while filling the trench structure so as to surround a square-prism-like ferromagnetic free layer 6 with isolation layer 4 in between. Insulation layer 3 is provided over ferromagnetic fixed layer 5, isolation layer 4 and ferromagnetic free layer 6. Ferromagnetic fixed layer 5 is connected to an external power supply (not shown) through fixed layer electrode 8 by way of a through hole opened in insulation layer 3. Ferromagnetic free layer 6 is connected to the external power supply through free layer electrode 7 provided through another through hole opened in insulation layer 3.

FIGS. 4A to 4G explain the steps of fabricating the element of Example 1 about the principal part thereof. First, an explanation will be made by using FIG. 4A. For substrate 1, a silicon substrate with a thickness of 500 µm was used. A trench structure was formed on the surface of substrate 1, with a depth of 220 nm and a square horizontal cross section. Then, the surface of silicon substrate 1 was subjected to thermal oxidation in an atmosphere of oxygen to form a silicon oxide film with a thickness of 100 nm as substrate insulation layer 2. Subsequently, ferromagnetic fixed layer 5 of Co was formed with a thickness of 100 nm. The film thickness of ferromagnetic fixed layer 5 is preferably 20 to 100 nm in order to sufficiently fix magnetization. Then, isolation layer 4 of Cu was formed with a thickness of 10 nm. The thickness of isolation layer 4 is preferably made to be 3 nm or more for ensuring magnetic isolation between ferromagnetic fixed layer 5 and ferromagnetic free layer 6, and is preferably made to be 10 nm or less to ensure electrical conduction. Insulation material such as nonmagnetic metal or aluminum oxide can be used as the material. Following this, a Co layer was formed with a thickness of 30 nm to fill the trench structure with ferromagnetic free layer 6 to form ferromagnetic free layer 6. It is necessary only that the Co layer to be formed has a thickness for sufficiently filling the trench structure. The width t of the trench structure filled with ferromagnetic free layer 6 shown in FIG. 4A was 10 nm. Preferably width t is between 2 nm and 10 nm in order to make magnetization reversal easy. The depth d from the surface of substrate insulation layer 2 to the bottom of the trench with ferromagnetic free layer 6 was 10 nm. The depth d is preferably between 3 nm and 200 nm to sufficiently ensure the area of an interface between ferromagnetic fixed layer 5 and ferromagnetic free layer 6.

Figure 4A:
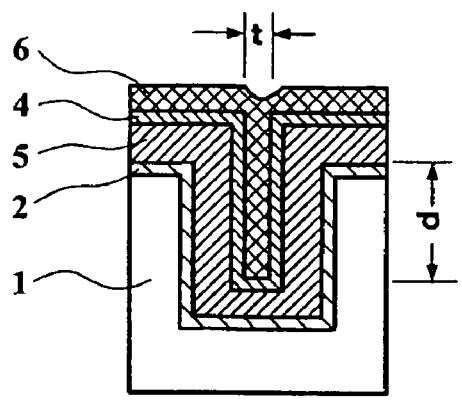
FIG. 4A is a schematic cross sectional view for explaining the fabrication process of the element according to any one of Example 1 to Example 4, the view showing the step in a state in which a substrate insulation film, a ferromagnetic fixed layer, an insulation layer and a ferromagnetic free layer are formed on a substrate having a trench structure formed therein.
Figure 4B:
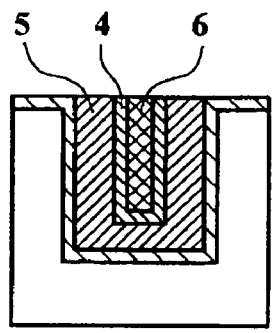
FIG. 4B is a schematic cross sectional view showing a state in which the surface of the element is subjected to etch-back in the step subsequent to the step shown in FIG. 4A.
Figure 4C:
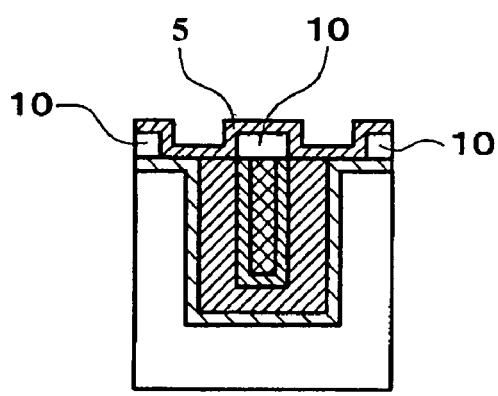
FIG. 4C is a schematic cross sectional view showing a state in which a photoresist applied on the surface of the element is patterned on which a thin film of ferromagnet is formed in the step subsequent to the step shown in FIG. 4B.
Figure 4D:
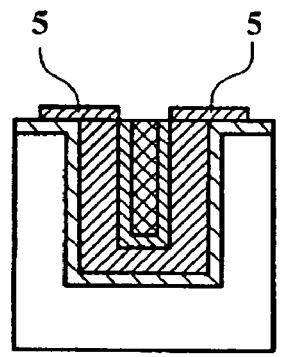
FIG. 4D is a schematic cross sectional view showing a state in which the thin film of ferromagnet on the photoresist is removed together with the photoresist in the step subsequent to the step shown in FIG. 4C.
Figure 4E:
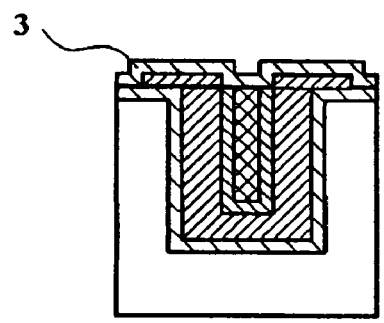
FIG. 4E is a schematic cross sectional view showing a state in which an insulation layer is formed on the element in the step subsequent to the step shown in FIG. 4D.
Figure 4F:
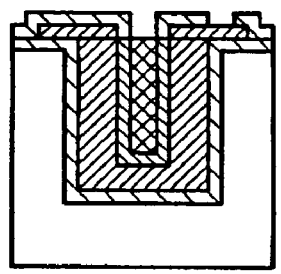
FIG. 4F is a schematic cross sectional view showing a state in which some parts of the insulation layer on the element are removed to be opened as through holes in the step subsequent to the step shown in FIG. 4E.
Figure 4G:
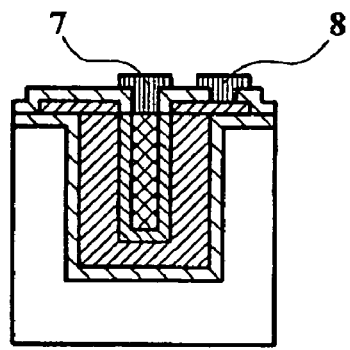
FIG. 4G is a schematic cross sectional view showing a state in which a free layer electrode and a fixed layer electrode are formed through the respective through holes opened in the insulation layer to make the element completed in the step subsequent to the step shown in FIG. 4F.

Next, as shown in FIG. 4B, the surface of the element was subjected to etch-back down to substrate insulating layer 2. Then, as shown in FIG. 4C, photoresist 10 was applied on the whole surface with a thickness of 10 nm before carrying out patterning for coating ferromagnetic free layer 6, isolation layer 4 and the periphery of the element with photoresist 10. After this, a thin film was formed thereon with a ferromagnet. The material of this thin film was the same as that of ferromagnetic fixed layer 5. Subsequently, as shown in FIG. 4D, the ferromagnetic thin film on photoresist 10 was removed by the lift-off method. Then, as shown in FIG. 4E, a silicon oxide film was formed by plasma CVD method to a thickness of 200 nm to be provided as insulation layer 3. Next, as shown in FIG. 4F, some parts of insulation layer 3 were removed to form through holes for bringing each of ferromagnetic fixed layer 5 and ferromagnetic free layer 6 into conduction. Then, as shown in FIG. 4G, free layer electrode 7 and fixed layer electrode 8, both being made of gold, were formed through the through holes opened in insulation layer 3, and the element of Example 1 was obtained.

The operating conditions and characteristics of Example 1 are shown in Table 1. The MR ratio shown in Table 1 is defined by a measured resistance value in the high resistance state and a measured resistance value in the low resistance state of the element as MR ratio=(high resistance value−low resistance value)/(high resistance value+low resistance value)×100(%). A critical current density is a minimum current density for causing magnetization reversal. In Table 1, letting a current flow from fixed layer electrode 8 to free layer electrode 7 with a current density of $5 \times 10^8$ A/cm², for example, is equivalent to letting a current of 0.6 mA in an absolute value flow from fixed layer electrode 8 to free layer electrode 7. As a result of measuring the resistance values of the element with a detecting current of 300 µA, the resistance value in the high resistance state was 4.6 Ω and that in the low resistance state was 4.0Ω.

EXAMPLE 2

Figure 2:
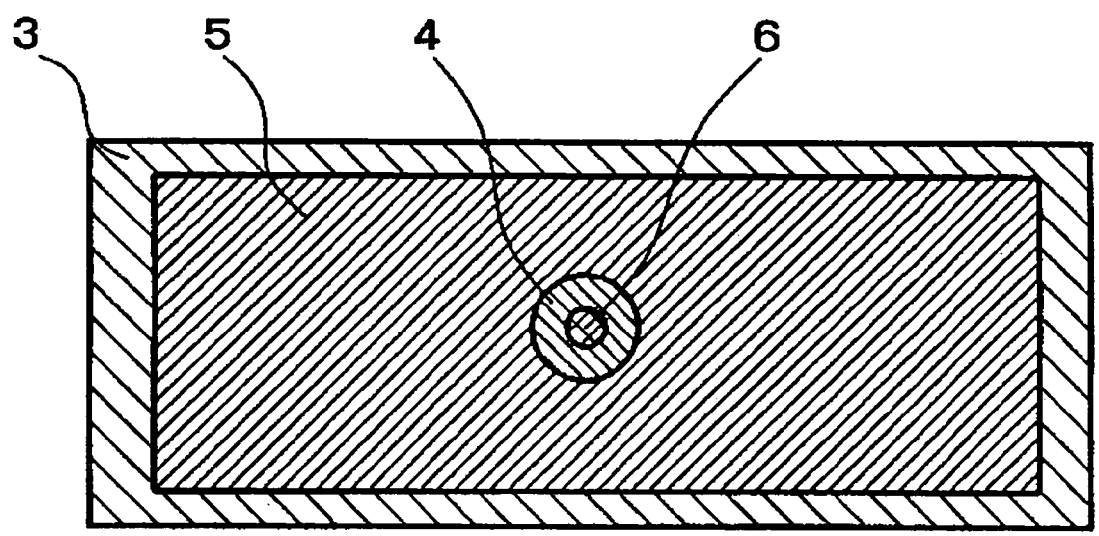
FIG. 2 is a schematic cross sectional view for explaining the arrangement of an element of Example 2 according to the invention.

FIG. 2 is a schematic cross sectional view for explaining the arrangement of an element of Example 2 according to the invention equivalent to the element shown in FIG. 1A. As shown in FIG. 2, the element was fabricated similarly to the element of Example 1, except that a trench structure was formed in a cylinder shape and was provided as Example 2. The shape of ferromagnetic free layer 6 was like a cylinder with a diameter of 10 nm and a depth of 10 nm.

The operating conditions and characteristics of Example 2 are shown in Table 1. As a result of measuring the resistance values of the element with a detecting current of 300 µA, the resistance value in the high resistance state was 4.6 Ω and that in the low resistance state was 4.0 Ω.

EXAMPLE 3

Figure 3A:
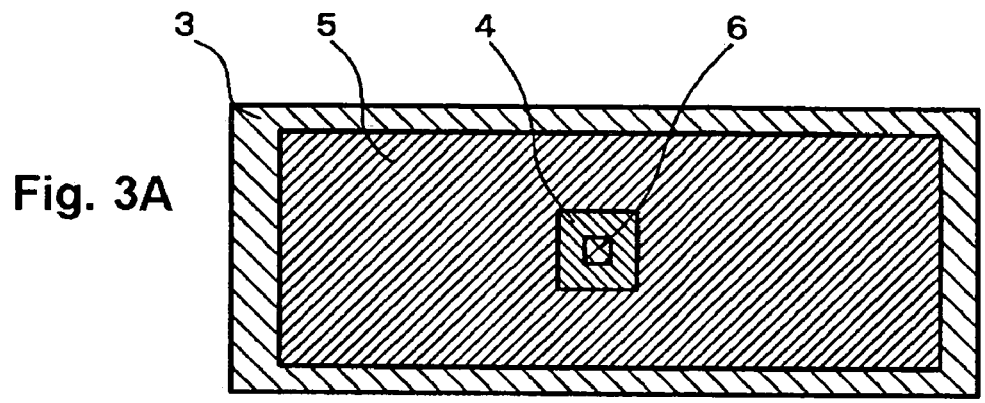
FIG. 3A is a schematic cross sectional view taken on line B-B of FIG. 3B for explaining the arrangement of an element of Example 3 according to the invention.
Figure 3B:
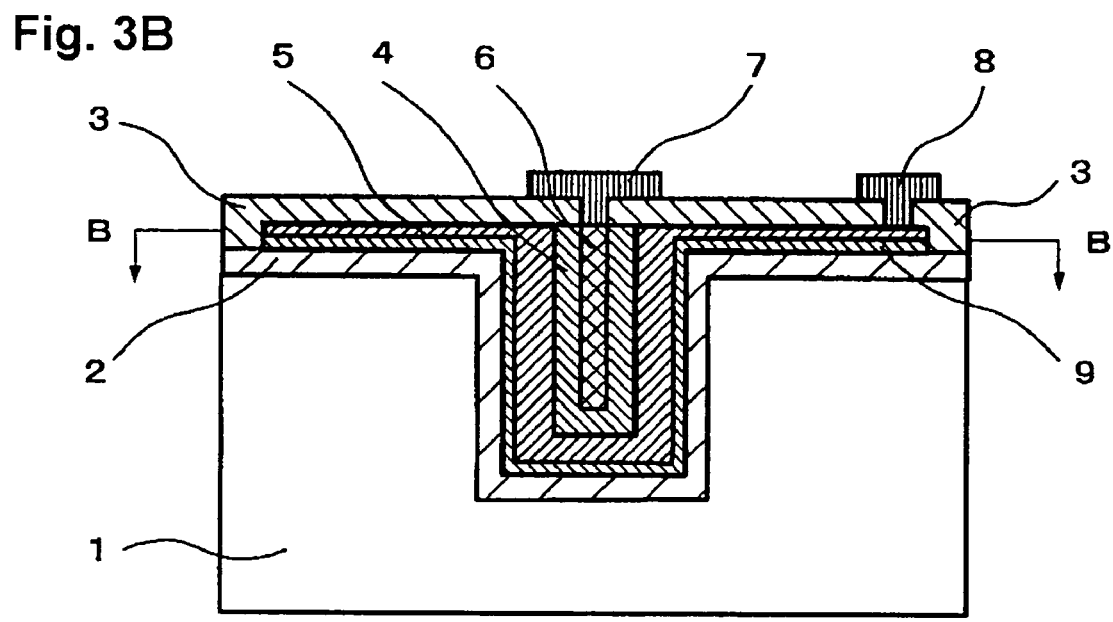
FIG. 3B is a schematic cross sectional view for explaining the arrangement of the element of Example 3 according to the invention.

Example 3 is an example in which a laminated electrode was additionally provided for ferromagnetic fixed layer 5 in the element of Example 1 to adjust a resistance value. In each of FIGS. 3A and 3B, there is shown the arrangement of Example 3. FIG. 3B is a schematic cross sectional view for explaining the arrangement of Example 3 and FIG. 3A is a schematic cross sectional view taken on line B-B of FIG. 3B.

After substrate insulation layer 2 with a silicon oxide film has been formed, the element was fabricated similarly to the element as Example 1 to be obtained as Example 3 except that laminated electrode 9 made of Cu was formed with a thickness of 20 nm and the film thickness of the subsequently formed ferromagnetic fixed layer 5 was made 80 nm.

The operating conditions and characteristics of Example 3 are shown in Table 1. As a result of measuring the resistance values of the element with a detecting current of 300 µA, the resistance value in the high resistance state was 3.6 Ω and that in the low resistance state was 2.8 Ω.

EXAMPLE 4

An element was fabricated similarly to the element of Example 3 except that a trench structure was formed in a cylinder shape as shown in FIG. 2, and was provided as Example 4. The shape of ferromagnetic free layer 6 was like a cylinder with a diameter of 10 nm and a depth of 10 nm.

The operating conditions and characteristics of Example 4 are shown in Table 1. As a result of measuring the resistance values of the element with a detecting current of 300 µA, the resistance value in the high resistance state was 3.6 Ω and that in the low resistance state was 2.8 Ω.

In each of the above examples, the cross sectional shape in the horizontal direction of the trench structure was provided as a square or a circle. The cross sectional shape, however, is not limited to this, but can be an ellipse or a rectangle. Moreover, by providing unevenness in the cross sectional shape, for example in the shape of a star, it is possible to increase the area at the interface between the ferromagnetic fixed layer and the ferromagnetic fixed layer to further enhance the effect of the invention.

In the above examples, an arrangement was provided in which the ferromagnetic fixed layer surrounds the ferromagnetic free layer, and the free layer electrode side surface of the ferromagnetic free layer is not surrounded. The invention, however, is not limited to this, but can be arranged so that the ferromagnetic fixed layer surrounds only a part of the ferro-

TABLE 1

| SAMPLE | CRITICAL CURRENT DENSITY WHEN CURRENT FLOWS FROM FREE LAYER ELECTRODE TO FIXED LAYER ELECTRODE | CRITICAL CURRENT DENSITY WHEN CURRENT FLOWS FROM FIXED LAYER ELECTRODE TO FREE LAYER ELECTRODE | MR RATIO |
|---|---|---|---|
| EXAMPLE 1 | $4 \times 10^8$ A/cm² | $5 \times 10^8$ A/cm² | 7% |
| EXAMPLE 2 | $4 \times 10^8$ A/cm² | $5 \times 10^8$ A/cm² | 7% |
| EXAMPLE 3 | $2 \times 10^8$ A/cm² | $3 \times 10^8$ A/cm² | 12% |
| EXAMPLE 4 | $2 \times 10^8$ A/cm² | $3 \times 10^8$ A/cm² | 12% | magnetic free layer like an arrangement in which a semicircle part of the ferromagnetic fixed layer surrounds the ferromagnetic free layer.

EXAMPLE 5

Example 5 is an example in which a ferromagnetic fixed layer, a ferromagnetic free layer and associated layers are arranged on the upper part of a substrate.

Figure 5A:
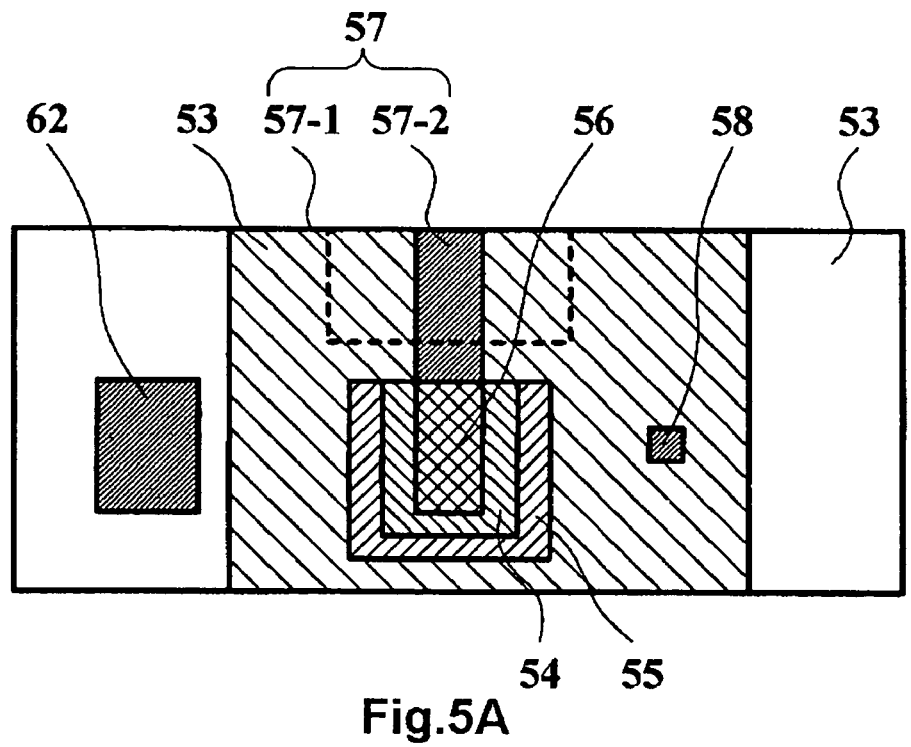
FIG. 5A is a schematic cross sectional view taken on line C-C of FIG. 5B for explaining the arrangement of an element of Example 5 according to the invention.
Figure 5B:
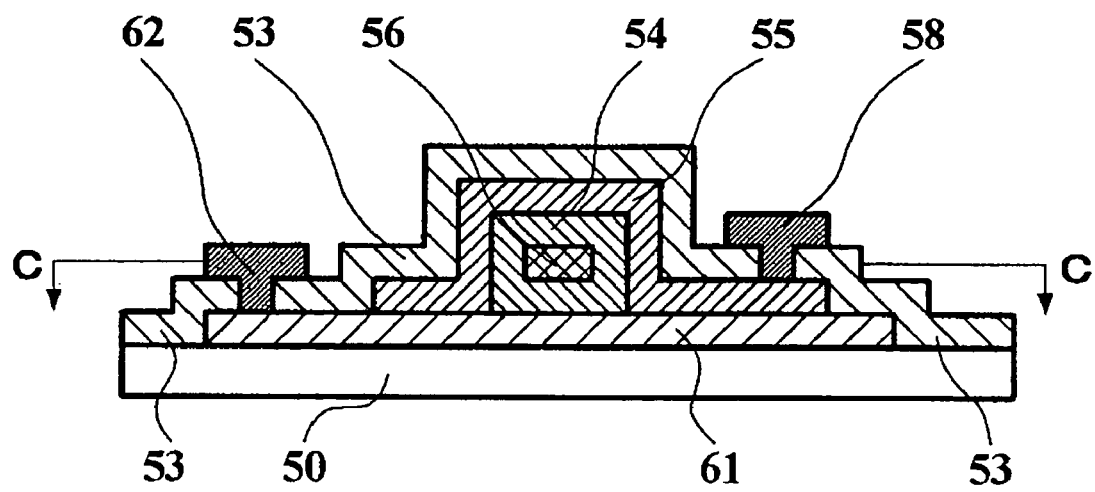
FIG. 5B is a schematic cross sectional view for explaining the arrangement of the element of Example 5 according to the invention.

FIGS. 5A and 5B are views for explaining the arrangement of an element of Example 5 according to the invention with FIG. 5B being a schematic cross sectional view and FIG. 5A being a schematic cross sectional view taken on line C-C of FIG. 5B. Ferromagnetic first fixed layer 55 and ferromagnetic second fixed layer 61 are arranged on insulation substrate 50 so as to surround a rectangular-prism-like ferromagnetic free layer 56 with isolation layer 54 in between. Ferromagnetic free layer 56 is connected to an external power supply (not shown) through free layer electrode 57. Insulation layer 53 is provided over insulation substrate 50, ferromagnetic first fixed layer 55, ferromagnetic second fixed layer 61 and free layer electrode 57. Ferromagnetic first fixed layer 55 is connected to the external power supply through first fixed layer electrode 58 by way of a through hole opened in insulation layer 53. Ferromagnetic second fixed layer 61 is connected to the external power supply through second fixed layer electrode 62 provided through another through hole opened in insulation layer 53.

The fabrication of the element was carried out by using an ordinary semiconductor element forming process.

A silicon substrate with a thickness of 500 μm which has a silicon oxide layer formed on the surface was used for insulation substrate 50. A CoPt alloy layer was formed with a thickness of 100 nm for each of ferromagnetic first fixed layer 55 and ferromagnetic second fixed layer 61. A rectangular prism shaped Co layer was formed with a thickness of 5 nm and a bottom surface of 100 nm×100 nm for ferromagnetic free layer 56. A Cu layer with a thickness of 10 nm was formed for isolation layer 54, to isolate ferromagnetic free layer 56 from the two ferromagnetic first and second fixed layers 55 and 61. Isolation layer 54 surrounds ferromagnetic free layer 56 except the surface on free layer electrode 57 side. Ferromagnetic first fixed layer 55 and ferromagnetic second fixed layer 61 surround isolation layer 54 except the surface on free layer electrode 57 side. A low temperature deposition silicon oxide film with a thickness of 200 nm was formed by plasma CVD for insulation layer 53. Au was used for first fixed layer electrode 58 and second fixed layer electrode 62. First fixed layer electrode 58 and second fixed layer electrode 62 were brought into conduction with ferromagnetic first fixed layer 55 and ferromagnetic second fixed layer 61, respectively, through openings provided in insulation layer 53, each having a dimension of 100 nm×100 nm. First, fixed layer electrode 58 and second fixed layer electrode 62 are brought into conduction on the outside of the element. For free layer electrode 57, Au was used to form an external power supply connecting section 57-1 with a thickness of 200 nm and a bottom surface of 200 μm×200 μm and a ferromagnetic free layer connecting section 57-2 with a width of 100 nm and a length of 200 nm. Free layer electrode 57 and ferromagnetic first fixed layer 55 are insulated from each other, and free layer electrode 57 and ferromagnetic second fixed layer 61 are insulated from each other.

The operating conditions and characteristics of Example 5 are shown in Table 2. In Table 2, letting a current flow from a fixed layer electrode to a free layer electrode means letting a current flow from a conduction section on the outside of the element to free layer electrode 57 through first fixed layer electrode 58 and second fixed layer electrode 62. Moreover, letting a current flow from the fixed layer electrode to the free layer electrode with a current density of $4 \times 10^7$ A/cm$^2$ is equivalent to letting a current of 8 mA in an absolute value flow. As a result of measuring the resistance values of the element with a detecting current of 300 μA, the resistance value in the high resistance state was 3.0 Ω and that in the low resistance state was 2.3 Ω.

TABLE 2

| SAMPLE | CRITICAL CURRENT DENSITY WHEN CURRENT FLOWS FROM FREE LAYER ELECTRODE TO FIXED LAYER ELECTODE | CRITICAL CURRENT DENSITY WHEN CURRENT FLOWS FROM FIXED LAYER ELECTRODE TO FREE LAYER ELECTODE | MR RATIO |
| --- | --- | --- | --- |
| EXAMPLE 5 | $1.7 \times 10^7$ A/cm$^2$ | $4 \times 10^7$ A/cm$^2$ | 13% |
| EXAMPLE 6 | $1.7 \times 10^7$ A/cm$^2$ | $4 \times 10^7$ A/cm$^2$ | 19% |

EXAMPLE 6

Figure 6:
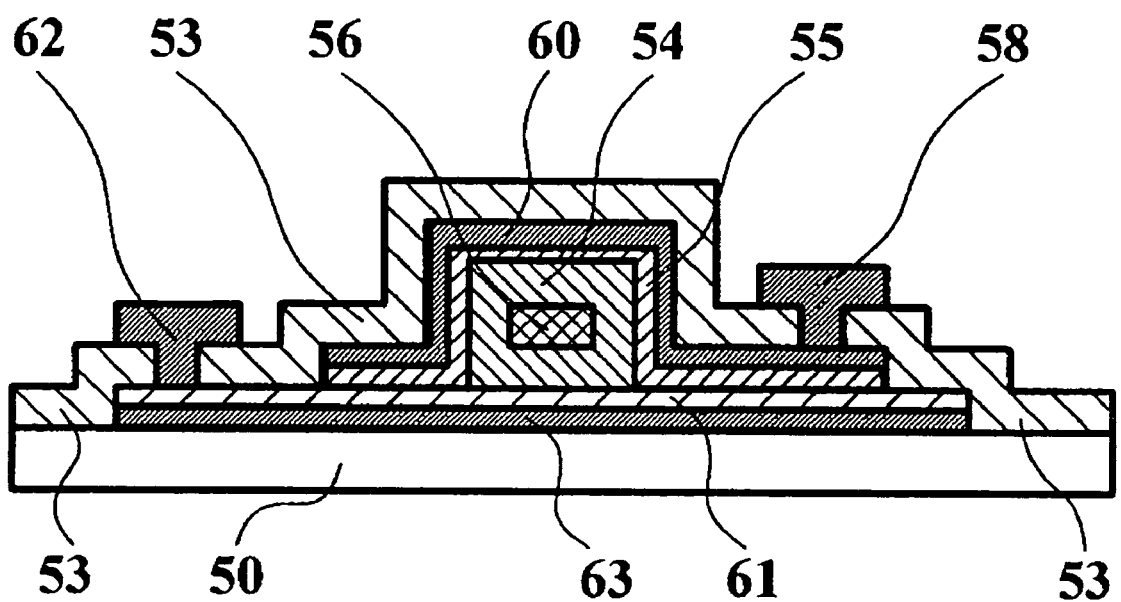
FIG. 6 is a schematic cross sectional view for explaining the arrangement of an element of Example 6 according to the invention.

Example 6 is an example in which a laminated electrode was additionally provided for the ferromagnetic fixed layer in the element of Example 5, to adjust a resistance value. FIG. 6 is a schematic cross sectional view for explaining the arrangement of an element of Example 6.

Ferromagnetic first fixed layer 55 is made to have a thickness of 80 nm. A first laminated electrode 60 made of Cu with a thickness of 20 nm was formed on ferromagnetic first fixed layer 55. Moreover, second laminated electrode 63 made of Cu with a thickness of 20 nm was formed on insulation substrate 50, on which ferromagnetic second fixed layer 61 was formed with a thickness of 80 nm. Except for this, the element was fabricated similarly to the element of Example 5 to be obtained as Example 6.

The operating conditions and characteristics of Example 6 are shown in Table 2. As a result of measuring the resistance values of the element with a detecting current of 300 μA, the resistance value in the high resistance state was 2.0 Ω and that in the low resistance state was 1.4 Ω.

Thus, a spin injection magnetization reversal element has been described according to the present invention. While the present invention has been particularly shown and described with reference to preferred embodiments thereof, it will be understood by those skilled in the art that the foregoing and other changes in form and details can be made therein without departing from the spirit and scope of the present invention. Accordingly, it should be understood that the methods and devices described herein are illustrative only and are not limiting upon the scope of the invention.

The following is a key to numbers used in the figures
    100 insulation substrate
    104 first isolation layer
    105 ferromagnetic first fixed layer
    106 ferromagnetic free layer 107 free layer electrode
108 first fixed layer electrode
111 ferromagnetic second fixed layer
112 second fixed layer electrode
114 second isolation layer
200 insulation substrate
204 isolation layer
205 ferromagnetic fixed layer
206 ferromagnetic free layer
207 free layer electrode
208 fixed layer electrode

What is claimed is:

1. A spin injection magnetization reversal element comprising, in order, a ferromagnetic fixed layer, an isolation layer and a ferromagnetic free layer, in which element flow of a current between the ferromagnetic fixed layer and the ferromagnetic free layer causes transition between a state in which the direction of the magnetization of the ferromagnetic fixed layer and the direction of the magnetization of the ferromagnetic free layer are in parallel with each other and a state in which the directions of the magnetization are in antiparallel with each other,
   wherein the ferromagnetic fixed layer surrounds the ferromagnetic free layer,
   wherein a free layer electrode is electrically connected to the ferromagnetic free layer apart from the ferromagnetic fixed layer and a fixed layer electrode is electrically connected to the ferromagnetic fixed layer apart from the ferromagnetic free layer, and
   wherein an area with which the ferromagnetic fixed layer is in contact with the isolation layer is larger than an area with which the ferromagnetic free layer is in contact with the isolation layer.

2. The spin injection magnetization reversal element according to claim 1, wherein an electrode is connected onto one surface of the ferromagnetic free layer, and the ferromagnetic fixed layer is arranged on the other surfaces of the ferromagnetic free layer with the isolation layer in between.

3. A spin injection magnetization reversal element comprising a ferromagnetic fixed layer, an isolation layer and a ferromagnetic free layer, in which element flow of a current between the ferromagnetic fixed layer and the ferromagnetic free layer causes transition between a state in which the direction of the magnetization of the ferromagnetic fixed layer and the direction of the magnetization of the ferromagnetic free layer are in parallel with each other and a state in which the directions of the magnetization are in antiparallel with each other,
   wherein the ferromagnetic fixed layer is divided into a ferromagnetic first fixed layer and a ferromagnetic second fixed layer, the isolation layer is divided into a first isolation layer and a second isolation layer, the ferromagnetic first fixed layer is arranged on one of opposed principal surfaces of the ferromagnetic free layer with the first isolation layer in between, the ferromagnetic second fixed layer is arranged on the other of the opposed principal surfaces of the ferromagnetic free layer with the second isolation layer put between, and the ferromagnetic first fixed layer and the ferromagnetic second fixed layer are in direct contact with each other.

4. The spin injection magnetization reversal element according to claim 1, wherein a product of the magnetization and the volume of the ferromagnetic fixed layer is larger than a product of the magnetization and the volume of the ferromagnetic free layer.

5. The spin injection magnetization reversal element according to claim 3, wherein a product of the magnetization and the volume of the ferromagnetic fixed layer is larger than a product of the magnetization and the volume of the ferromagnetic free layer.

6. The spin injection magnetization reversal element according to claim 1, wherein the saturation magnetization of the ferromagnetic free layer is smaller than the saturation magnetization of the ferromagnetic fixed layer.

7. The spin injection magnetization reversal element according to claim 3, wherein the saturation magnetization of the ferromagnetic free layer is smaller than the saturation magnetization of the ferromagnetic fixed layer.

8. The spin injection magnetization reversal element according to claim 1, wherein the coercive force of the ferromagnetic free layer is smaller than the coercive force of the ferromagnetic fixed layer.

9. The spin injection magnetization reversal element according to claim 3, wherein the coercive force of the ferromagnetic free layer is smaller than the coercive force of the ferromagnetic fixed layer.

10. The spin injection magnetization reversal element according to claim 1, wherein the ferromagnetic fixed layer is connected to a plurality of electrodes conducting one another.

11. The spin injection magnetization reversal element according to claim 3, wherein the ferromagnetic fixed layer is connected to a plurality of electrodes conducting one another.

12. The spin injection magnetization reversal element according to claim 1, wherein the isolation layer is made of nonmagnetic metal.

13. The spin injection magnetization reversal element according to claim 3, wherein the isolation layer is made of nonmagnetic metal.

14. The spin injection magnetization reversal element according to claim 1, wherein the isolation layer is made of insulation material.

15. The spin injection magnetization reversal element according to claim 3, wherein the isolation layer is made of insulation material.

16. The spin injection magnetization reversal element according to claim 1, wherein the isolation layer is made of copper.

17. The spin injection magnetization reversal element according to claim 3, wherein the isolation layer is made of copper.

18. The spin injection magnetization reversal element according to claim 1, wherein the isolation layer is made of aluminum oxide.

19. The spin injection magnetization reversal element according to claim 3, wherein the isolation layer is made of aluminum oxide.

20. The spin injection magnetization reversal element according to claim 1, wherein the ferromagneitc fixed layer and the ferromagnetic free layer are made of metallic cobalt.

21. The spin injection magnetization reversal element according to claim 3, wherein the ferromagneitc fixed layer and the ferromagnetic free layer are made of metallic cobalt.

22. The spin injection magnetization reversal element according to claim 2, wherein an electrode is connected onto one surface of the ferromagnetic fixed layer, and the ferromagnetic free layer is arranged on the other surface of the ferromagnetic fixed layer with the isolation layer in between.

* * * * *